(12) United States Patent
Iida

(10) Patent No.: US 8,089,543 B2
(45) Date of Patent: Jan. 3, 2012

(54) SOLID-STATE IMAGE PICKUP ELEMENT AND SOLID-STATE IMAGE PICKUP DEVICE

(75) Inventor: Yoshinori Iida, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 569 days.

(21) Appl. No.: 12/350,459

(22) Filed: Jan. 8, 2009

(65) Prior Publication Data

US 2009/0190016 A1 Jul. 30, 2009

(30) Foreign Application Priority Data

Jan. 29, 2008 (JP) .................. 2008-017232

(51) Int. Cl.
*H04N 3/14* (2006.01)
*H04N 5/335* (2006.01)
(52) U.S. Cl. .................. 348/308; 348/294; 348/302
(58) Field of Classification Search .................. 348/294, 348/302, 308
See application file for complete search history.

(56) References Cited

U.S. PATENT DOCUMENTS

2008/0170149 A1 7/2008 Iida et al.
2008/0192135 A1* 8/2008 Yamashita .................. 348/308

FOREIGN PATENT DOCUMENTS

JP 3759435 1/2006
JP 2006-49338 2/2006

OTHER PUBLICATIONS

Shin Iwabuchi et al, A Back Illuminated High-Sensitivity Small-Pixel Color CMOS Image Sensor with Flexible Layout of Metal Wiring, International Solid-State Circuits Conference, Technical Digest, Session 16, MEMS and Sensors,16.8, 2006, pp. 302-303.

* cited by examiner

*Primary Examiner* — William Choi
(74) *Attorney, Agent, or Firm* — Oblon, Spivak, McClelland, Maier & Neustadt, L.L.P.

(57) ABSTRACT

A solid-state image pickup element includes: a semiconductor layer of a first conductivity type; a pixel area having pixels formed in a matrix form, each of the pixels including a photoelectric conversion element having a pn junction formed of the semiconductor layer of the first conductivity type and a first semiconductor region of a second conductivity type, a second semiconductor region of the first conductivity type formed on a first surface side of the semiconductor layer, and potential control wiring connected electrically to the second semiconductor region; and a pixel signal readout circuit including at least one MOS transistor formed on the first surface side of the semiconductor layer in the pixel area to have a source and a drain formed of an impurity region of the second conductivity type. Incidence of light to the photoelectric conversion element is made from a second surface side opposite to the first surface side.

20 Claims, 4 Drawing Sheets

SOLID-STATE IMAGE PICKUP ELEMENT AND SOLID-STATE IMAGE PICKUP DEVICE

CROSS-REFERENCE TO RELATED APPLICATION

This application is based upon and claims the benefit of priority from prior Japanese Patent Application No. 2008-17232 filed on Jan. 29, 2008 in Japan, the entire contents of which are incorporated herein by reference.

BACKGROUND OF THE INVENTION

1. Field of the Invention

The present invention relates to a solid-state image pickup element and a solid-state image pickup device.

2. Related Art

Because of spread of the digital camera and the cellular phone with built-in camera in recent years, demands for the solid-state image pickup element are increasing. In particular, demands for the CMOS solid-state image pickup element which can be manufactured by the CMOS process which is a general semiconductor manufacturing process arise. In recent years, such a solid-state image pickup element is required to have a smaller size and a larger number of pixels. It has become an important issue to make the pixel size smaller.

As compared with a reduction of a plane size parallel to the semiconductor substrate surface consequent upon the smaller pixel size, however, a reduction in a depth direction perpendicular to the semiconductor substrate surface is not scaled at the same time. Problems caused by this are being actualized.

In other words, even if the size of a pixel area in the horizontal direction is reduced, the distance between the silicon substrate surface on which a photodiode is formed and a microlens for optically expanding the aperture ratio is not reduced. Therefore, a part of incident light is reflected by a metal wiring layer, in a pixel area peripheral part where incident light from an image forming lens is incident aslant. In other words, the so-called "eclipse" or "vignetting" phenomenon occurs in the pixel area peripheral part, and sensitivity nonuniformity occurs.

Furthermore, if it is attempted to mount a circuit designed to use the latest CMOS process on a peripheral circuit in order to implement "system on chip" which is a feature of the CMOS solid-state image pickup element, then the distance between the silicon substrate surface and the microlens is made long by multi-layer wiring in the CMOS process, and the "eclipse" or "vignetting" becomes further apt to occur.

As a device configuration for breaking down such a situation, development of a back-illuminated CMOS sensor is reported (see, for example, Japanese Patent No. 3759435 and S. Iwabuchi et al., ISSCC Tech. Digest, pp. 302-303, 2006).

In such a back-illuminated CMOS sensor, the silicon substrate must be thin in order to efficiently collect signal electrons generated by incident light from the back side absorbed at the silicon substrate. For example, in the aforementioned S. Iwabuchi et al., ISSCC Tech. Digest, pp. 302-303, 2006, the silicon substrate is formed as a thin film having a thickness of 4 μm.

A problem posed by the silicon substrate formed as the thin film becomes remarkable when the incident light intensity is high, i.e., when an image of high light is taken. In other words, if excessive electron-hole pairs are generated by incidence of the high light, then excessive signal electrons which have exceeded the saturation charge quantity of the photodiode overflow and are injected into a photodiode of an adjacent pixel, resulting in a problem of blooming or crosstalk.

In a method proposed against this problem, a channel under a transfer gate is utilized as a path for lateral overflow by providing a transfer transistor in which a photodiode and floating diffusion are separated in a storage period with a gate voltage condition which does not bring the transfer transistor into a complete off state.

When this method is used, however, the potential of the overflow channel varies in channels under the influence of the threshold variation of the transfer transistor which is a MOS transistor and consequently the potential variation appears in the output at the time of saturation as a fixed pattern.

On the other hand, a method of forming an overflow channel for excessive signal electrons from the photodiode in a bulk area is also proposed under the notion that the potential variation is caused by the MOS structure (see, for example, JP-A 2006-49338 (KOKAI)).

In this method, however, the barrier height of the overflow channel is controlled by using a silicon substrate impurity concentration which is an extremely low concentration, and consequently its control is substantially difficult.

SUMMARY OF THE INVENTION

The present invention has been made in view of these circumstances, and an object thereof is to provide a solid-state image pickup element and a solid-state image pickup device capable of uniformly and accurately discharging excessive charges generated when high light is incident.

A solid-state image pickup element according to a first aspect of the present invention includes: a semiconductor layer of a first conductivity type; a pixel area having pixels formed in a matrix form, each of the pixels including a photoelectric conversion element having a pn junction formed of the semiconductor layer of the first conductivity type and a first semiconductor region of a second conductivity type different from the first conductivity type, a second semiconductor region of the first conductivity type formed on a first surface side of the semiconductor layer, and potential control wiring connected electrically to the second semiconductor region; and a pixel signal readout circuit including at least one MOS transistor formed on the first surface side of the semiconductor layer in the pixel area to have a source and a drain formed of an impurity region of the second conductivity type, wherein the first semiconductor region is disposed so as to be adjacent to the impurity region of the second conductivity type in the MOS transistor with interposing the semiconductor layer therebetween, and incidence of light to the photoelectric conversion element is made from a second surface side opposite to the first surface side.

A solid-state image pickup device according to a second aspect of the present invention includes: the solid-state image pickup element according to the first aspect; an optical system which leads incident light to the solid-state image pickup element; and a signal processor which conducts processing on an electric signal output from the solid-state image pickup element.

DETAILED DESCRIPTION OF THE INVENTION

Figure 1:
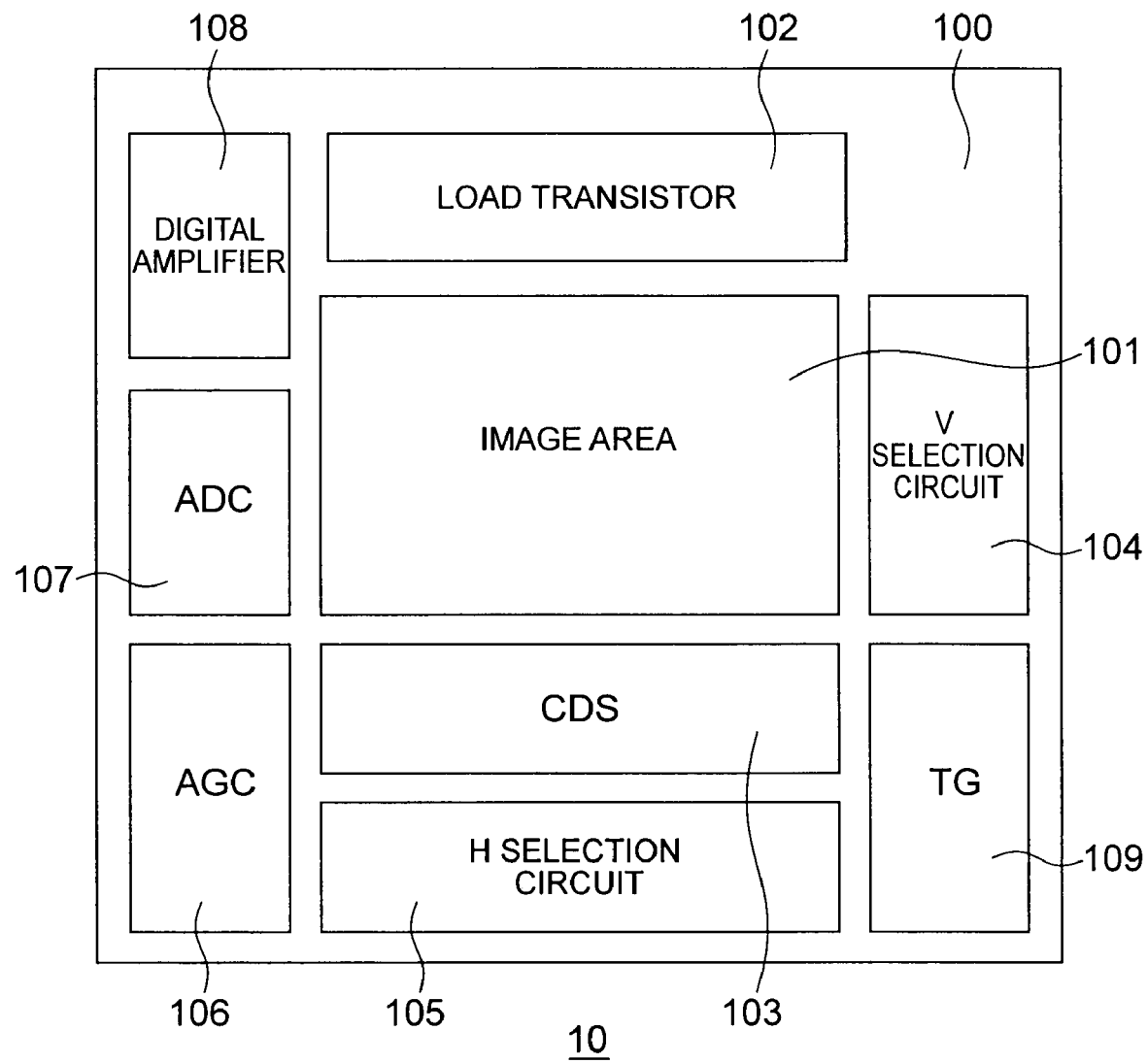
FIG. 1 is a block diagram of a solid-state image pickup element according to an embodiment of the present invention.

Hereafter, embodiments of the present invention will be described in detail with reference to the drawings. In the drawings, the same parts are denoted by like reference characters and duplicated description will not be repeated. Furthermore, the drawings are schematic, and relations between thickness and plane dimensions and ratios between thicknesses of layers are different from actual values.

In addition, parts which are different in mutual relations between dimensions and ratios are included between drawings as well.

A solid-state image pickup element according to an embodiment of the present invention is shown in FIG. 1. A solid-state image pickup element 10 according to the present embodiment is formed on a solid-state image pickup element chip 100.

The solid-state image pickup element chip 100 includes an image area 101 having photoelectric conversion pixels arranged as a two-dimensional array to convert an incident optical signal to an electric signal by photoelectric conversion, and peripheral circuits disposed around the image pickup area 101. The peripheral circuits includes a load transistor part 102, a CDS (correlated double sampling circuit) 103, a V selection circuit 104, an H selection circuit 105, an AGC (automatic gain control circuit) 106, an ADC (A/D converter) 107, a digital amplifier 108, and a TG (timing generator) circuit 109 which generates timing pulses. As for the ADC 107, it is possible to adopt a column type CDS-ADC circuit configuration formed as one body with the CDS circuit 103 (see, for example, T. Sugiki et al., ISSCC 2000 Technical Digest, p. 108, 2000). Furthermore, the TG 109, the AGC 106, the ADC 107 and the digital amplifier 108 may be formed as separate chips. A signal processing circuit which is not shown in FIG. 1 may also be mounted.

Figure 2:
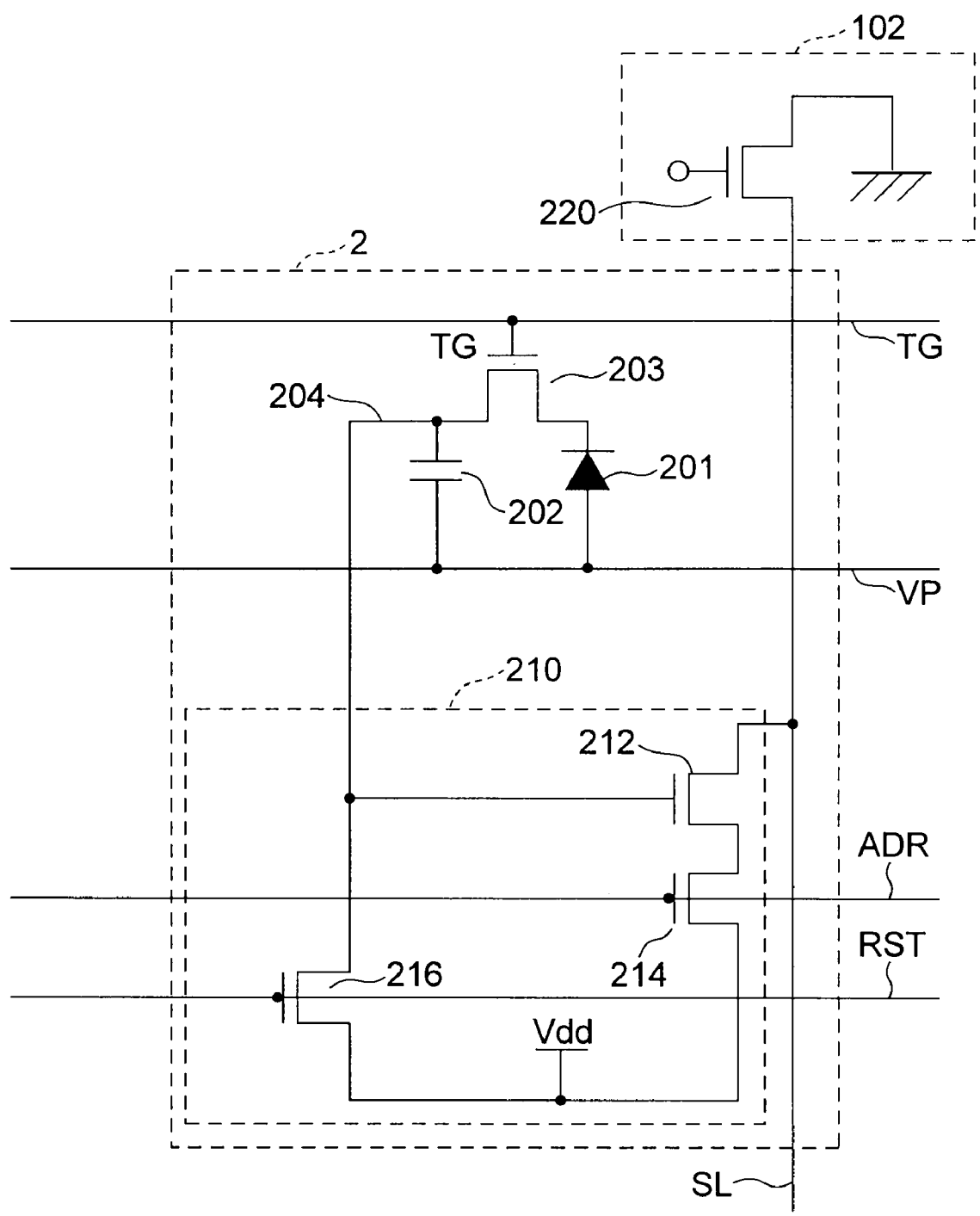
FIG. 2 is an equivalent circuit diagram of a pixel in a solid-state image pickup element in an embodiment.

In the image area 101, pixels having photoelectric conversion elements to convert incident signals to electric signals by photoelectric conversion are arranged in a two-dimensional matrix form. An equivalent circuit of each pixel is shown in FIG. 2. FIG. 2 is an equivalent circuit diagram of a pixel 2 in the solid-state image pickup element 10 according to the present embodiment and the load transistor part 102. The pixel 2 includes a photodiode 201 serving as a photoelectric conversion element, a capacitor 202, a transfer transistor (readout transistor) 203, and a readout circuit 210. The readout circuit 210 has a three-transistor structure formed of n-channel MOS transistors, and includes an amplification transistor 212, a selection transistor 214 and a reset transistor 216. The photodiode 201 is connected at its anode to a potential control line VP, and connected at its cathode to the transfer transistor 203 at a first one of its source and drain. A timing pulse from the TG circuit 109 is applied to the transfer transistor 203 at its gate. A second one of the source and drain of the transfer transistor 203 serving as a detection node 204 is connected to a first electrode of the capacitor 202. A second electrode of the capacitor 202 is connected to the potential control line VP. Typically, the capacitor 202 is a reverse-biased pn junction formed of the drain of the transfer transistor 204 and a source of the reset transistor 216. Therefore, the present embodiment has a configuration in which the pixel potential can be controlled from the external. The transfer transistor 203 is activated by a timing pulse from the TG circuit 109 to transfer signal charge stored across the photodiode 201 to the detection node 204.

The reset transistor 216 in the readout circuit 210 resets the signal charge transferred by the transfer transistor 203 on the basis of a reset signal RST. Since this reset operation is conducted with the transfer transistor 203 in the on-state, the potential at the detection node 204 and the potential at the photodiode 201 are reset. A signal voltage depending upon the signal charge is generated at the detection node 204. The amplification transistor 212 causes a voltage depending upon the potential at the detection node 204 to be generated on a signal line SL, and the selection transistor 214 activates the readout circuits 210 in pixels of a row selected by a row selection pulse ADR. The amplification transistor 212 within the readout circuit 210 constitutes a source follower circuit in combination with the load transistor 220 in the load transistor part 102 disposed outside the image area 101. On rows which are not selected by the selection transistor 214, the source follower circuit is isolated from a power supply voltage Vdd and inactivated by a selection transistor in the unselected state.

In the present embodiment, the photodiode 201 which is a photoelectric conversion element and the readout circuit 210 are provided in the pixel 2 as shown in FIG. 2. However, it is also possible for a plurality of photodiodes 201 to share one readout circuit. In that case, it becomes possible to hold down the average number of transistors per pixel and it is advantageous in making the pixel size smaller.

Referring back to FIG. 1, signals generated in pixels arranged in the matrix form are output in a time series form by the V selection circuit 104 and the H selection circuit 105 as described below. Signals subjected to photoelectric conversion in pixels disposed on a row selected by the V selection circuit 104 are read out by the readout circuits 210 in the pixels. This readout operation is processed by taking a row as the unit. Noise is removed in the CDS 103, and the signal voltage after the noise removal is retained. The retained signals are selected successively by the H selection circuit 105. The retained signal is sent to the AGC 106, then sent to the ADC 107, and converted to digital data. Thereafter, the signal is amplified by the digital amplifier 108 and output to the external. By the way, operations of the V selection circuit 104 and the H selection circuit 105 are controlled by timing pulses output from the TG circuit 109.

Figure 3:
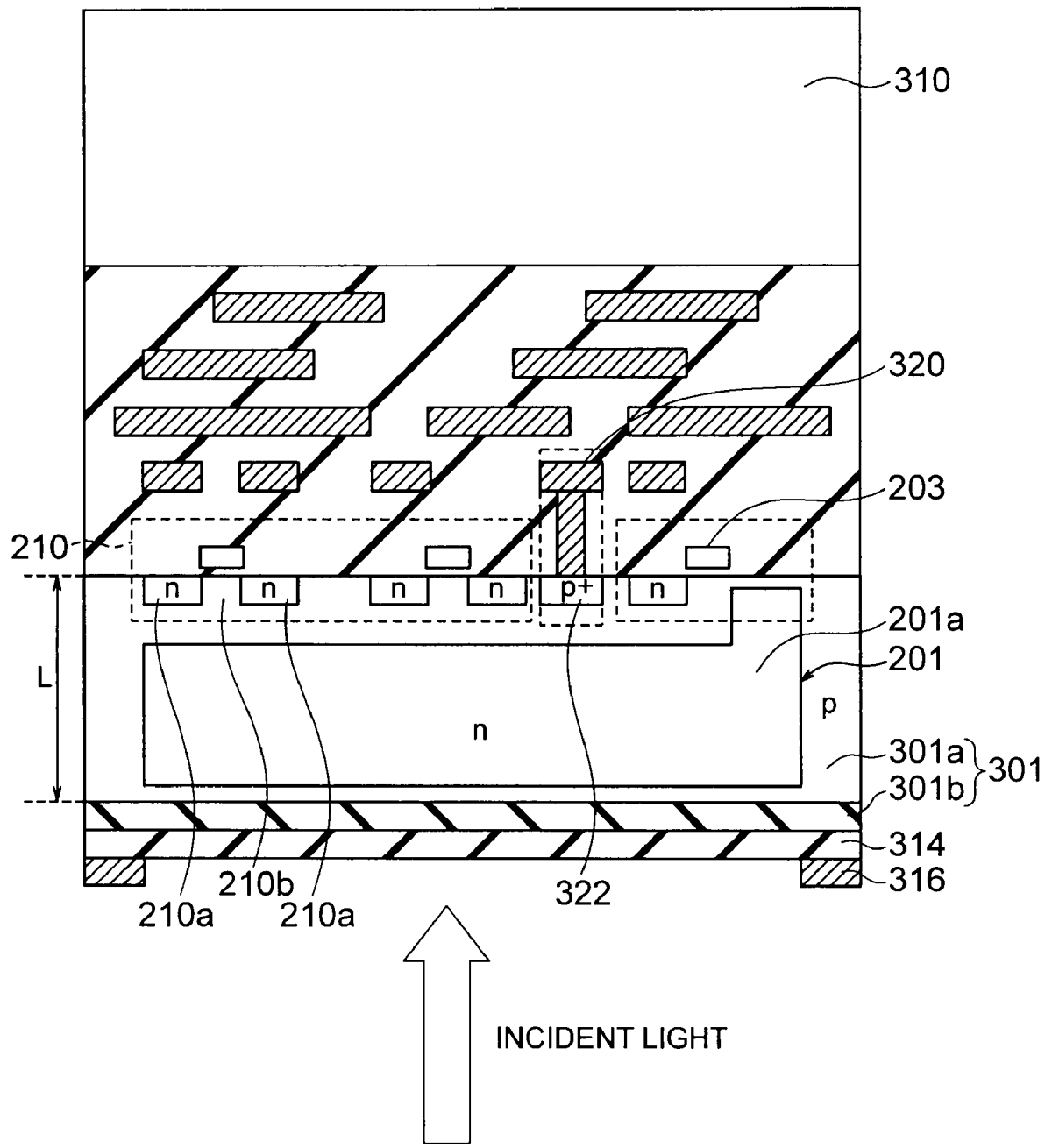
FIG. 3 is a sectional view of a solid-state image pickup element according to an embodiment.

FIG. 3 shows a section of the solid-state image pickup element 10 according to the present embodiment. The solid-state image pickup element 10 according to the present embodiment has a structure that incident light is incident from the bottom of FIG. 3, i.e., the back side as shown in FIG. 3. In other words, the solid-state image pickup element 10 according to the present embodiment is the so-called back-illuminated type.

The solid-state image pickup element 10 according to the present embodiment having the section shown in FIG. 3 is manufactured by using manufacturing processes described hereafter. An impurity region, a gate structure and a multilayer wiring structure in a silicon layer are formed by, for example, using a SOI substrate 301 and applying an ordinary CMOS sensor manufacturing process to a SOI layer 301a which is a surface of the SOI substrate 301. After a surface structure is formed, a support substrate 310 such as, for example, a glass substrate is bonded to the surface side.

After the bonding of the support substrate 310, a bulk substrate (not illustrated) of the SOI substrate 301 is removed from the back side by a process of grinding, polishing, CMP, silicon dry etching, silicon wet etching, or a suitable combination of them so as to expose the SOI layer 301a of the back side which becomes the incident light side via a $SiO_2$ layer 301b. In addition, it is desirable to form a thin high-concentration $p^+$-type impurity region on the silicon back side which is the incident light side. It is possible to reduce the dark current by separating a depletion layer in which the photodiode is formed from an interface between a silicon and silicon oxide film.

Thereafter, a SiN layer 314 is formed and a light shield layer 316 is formed to constitute a reflection prevention structure on the back side.

As for bonding pads (not illustrated), openings for pads (not illustrated) which pass through the support substrate 310 of the surface side may be formed, or openings for pads which pass through the SiN layer 314, the $SiO_2$ layer 301b, the SOI layer 301a and the multi-layer wiring layer from the back side may be formed.

In the case of a single-chip color image pickup element, in addition, a color filter array and an on-chip microlens are formed on the surface of the light incidence side.

As shown in FIG. 3, an n-type impurity region 201a which forms a pn junction serving as a photodiode is surrounded at its periphery by a p-type impurity region 301a. A buried photodiode of low noise characteristics can be obtained by optimizing the impurity concentration of the impurity region which forms the pn junction and thereby separating a depletion layer obtained by resetting the photodiode 201 from the surface of the silicon layer 301a.

It is desirable to form an impurity concentration profile in the n-type impurity region to transport the signal charges stored within the photodiode 201 to the source-drain region of the readout transistor (transfer transistor) 203. In addition, it is desirable to set the thickness (L) of the silicon layer 31a which forms the photodiode to approximately several microns in order to transport the signal charges.

In FIG. 3, potential control wiring 320 for controlling the potential at the p-type impurity region 301a in the pixel part is provided. Furthermore, a $p^+$-type impurity region 322 is formed to obtain a favorable electrical connection between the potential control wiring 320 and the p-type impurity region 301b. This potential control structure can be formed in the above-described ordinary CMOS sensor process.

Potentials at pixels can be controlled uniformly and accurately by making the potential control wiring common to all pixels in the pixel region and controlling the potential at the p-type impurity region 301b in the pixel part from the external of the pixel region via the potential control structure. Controlling the potentials at pixels uniformly and accurately has extremely important meaning. The pixel potential control is important, for example, in order to exclude bad influence caused by excessive electrons and excessive holes which are generated in the case of high luminance subject image pickup in which high light is incident on pixels.

When high light is incident on pixels, excessive signal electrons are generated in the photodiode 201 and the photodiode 201 saturates. At this time, excessive electrons which overflow the photodiode 201 arrive at adjacent photodiodes. As a result, phenomena such as blooming and crosstalk occur, resulting in noise components in the reproduced image. A technique of providing the so-called overflow drain structure and discharging the excessive electrons is effective in avoiding problems caused by the excessive electrons.

In the present embodiment, the overflow drain structure is formed of the n-type impurity region 201a which forms the photodiode 201, an n-type impurity region 210a which forms the readout circuit 210, and p-type impurity regions 210b sandwiched between these n-type impurity regions 210a as shown in FIG. 3. At this time, the n-type impurity regions 210a which form the readout circuit 210 function as the drain and the p-type impurity regions 210b function as overflow barriers. As for the n-type impurity regions 210a serving as the drains, drains always set to Vdd like the drain of the reset transistor or the drain of the selection transistor in the circuit shown in FIG. 2 are used. In such overflow drain structure, the threshold of a potential for discharging excessive elections depends on the p-type impurity regions 210b functioning as the barrier. If the potential at the p-type impurity regions 210b varies or becomes nonuniform in the pixel area, therefore, the saturation level of the photodiode 210 varies or becomes nonuniform, resulting in noise on the image. In the present embodiment, the potential at the p-type impurity region 301a in the pixel part can be controlled from an external circuit at this time. Therefore, the overflow barrier potential 210b can be controlled to become an optimum value. By the way, the potential applied via the potential control wiring may be a DC (direct current) potential or may be a pulsative potential.

In addition, it is also possible to finely adjust the depletion layer width of the pn junction part which forms the photodiode 201 by the potential control. As a result, it becomes possible to control the width of a non-sensitivity area which exists between the depletion layer end of the light incidence side and the surface of the silicon layer 301a. Tradeoff among white flaw image defects, the photodiode dark current and the blue sensitivity can be optimized electrically.

It is possible to exercise pulse potential control with a row taken as the unit by providing the potential control wiring 320 while taking a row as the unit. By doing so, it becomes possible to exercise control to attain an optimum potential in synchronism with operations of signal charge storage, charge transfer from the photodiode 201 and resetting the photodiode 201 in the device in which readout operation is conducted by taking a row as the unit. Thus, it becomes possible to obtain a high sensitivity, low noise, and wide dynamic range characteristics.

In the conventional structure, the potential control wiring structure is not present. As for the potential at the pixel, i.e., the potential at the p-type impurity region in the pixel, the p-type impurity region in the pixel is connected to the external of the pixel area via p-type impurity regions formed within the thin silicon layer in a lattice form. In other words, the resistance between the p-type impurity region in the pixel and the external of the pixel area is high. If the connection to an external power supply is thus high, then it is difficult to control the potential at the pixel part from the external uniformly and accurately. Especially when high light is incident, a potential variation is caused in the pixel part by excessive holes which are generated concurrently with the aforementioned excessive electrons.

In the structure according to the present embodiment, however, the potential at the pixel part is controlled with low resistance by the potential control wiring and the $p^+$ impurity region formed to contact with the potential control wiring serves as the drain to discharge the excessive holes. Even at the time of high light incidence, therefore, the potential at the pixel is stable and consequently noise in the reproduced image is made low.

In the case of a conventional CMOS sensor which is not the back-illuminated type, the p-type impurity region in the pixel part is connected to a silicon substrate which is in the range of several hundred microns under the photodiode. Therefore, the resistance to the substrate is low, and the problems caused by the excessive holes are not posed. Since the resistance to the substrate is low, however, the potential control in the pixel part by taking a row as the unit as described earlier cannot be exercised.

According to the present embodiment, noise on the reproduced image is not generated in image pickup of a high illuminance subject as heretofore described. In addition, since characteristics such as the photodiode dark current and the blue sensitivity can be improved by controlling the potential at the pixel part, a high-performance solid-state image pickup element can be obtained.

Figure 4:
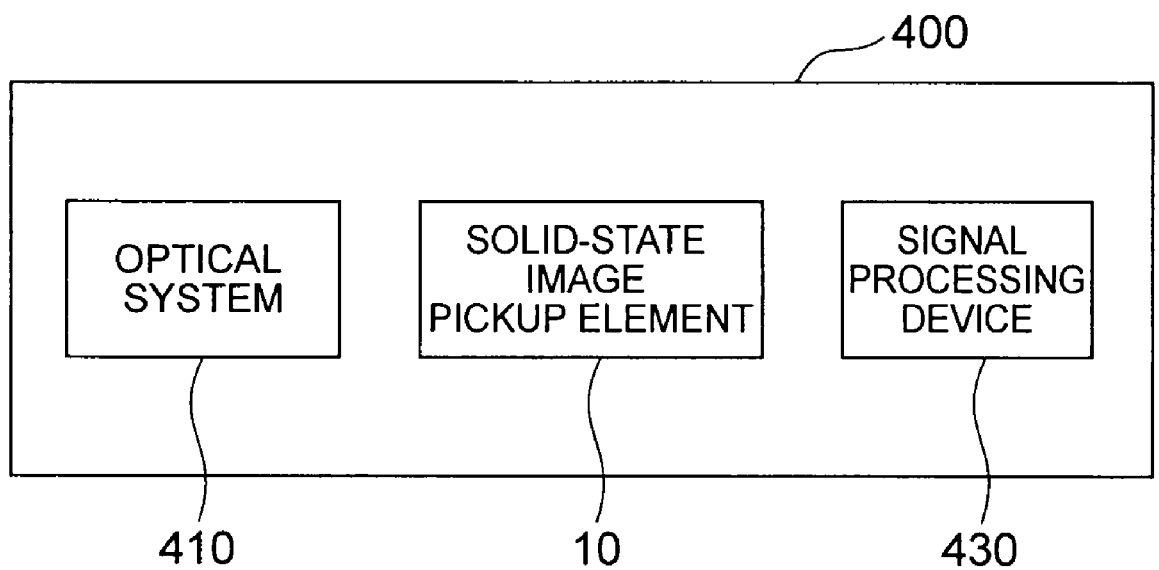
FIG. 4 is a block diagram of a solid-state image pickup device having a solid-state image pickup element according to an embodiment.

A solid-state image pickup device having the solid-state image pickup element 100 according to the present embodiment is shown in FIG. 4. A solid-state image pickup device 400 includes the solid-state image pickup element 100, an optical system 410 which supplies incident light to the solid-state image pickup element 100, and a signal processing device 430 which conducts processing on an electric signal output from the solid-state image pickup element 100.

According to the solid-state image pickup element according to the present embodiment, it becomes possible to adjust uniformly and accurately the overflow channel potential when discharging excessive signal electrons generated at the time of illumination of high light to the overflow drain by controlling the potential at the p-type impurity region in the pixel part to become a desired potential from the external of the pixel area via the potential control wiring. Even at the time of image pickup of a high light subject in a back-illuminated CMOS image sensor, it becomes possible to suppress the generation of the blooming, fixed pattern noise or the like.

Furthermore, according to the solid-state image pickup having the solid-state image pickup element according to the present embodiment, it becomes possible to adjust uniformly and accurately the overflow channel potential when discharging excessive signal electrons generated at the time of illumination of high light to the overflow drain by controlling the potential at the p-type impurity region in the pixel part to become a desired potential from the external of the pixel area via the potential control wiring. Even at the time of image pickup of a high light subject in a back-illuminated CMOS image sensor, it becomes possible to suppress the generation of the blooming, fixed pattern noise or the like.

As for the problems at the time of image pickup of a high light subject, it is necessary to consider not only excessive signal electrons but also excessive holes generated by the photoelectric conversion. In other words, excessive holes generated by incidence of high light are discharged to the bulk region in the case of an ordinary thick film silicon substrate. In the case of the back-illuminated device having a thin silicon substrate, however, the discharge of excessive holes is conducted via the p$^+$ impurity regions formed in a mesh form along a device isolation structure within the pixel area. As a result, the impedance of the discharge path for excessive holes becomes high. Accordingly, the excessive holes cannot be discharged sufficiently. Therefore, the state in which excessive holes are stored in the pixel part occurs, and the well potential at the pixel varies. This results in a problem that the operation of the photodiode and the operation of the readout circuit in the pixel part are modulated.

On the other hand, according to the solid-state image pickup element according to the present embodiment and the solid-state image pickup device having the solid-state image pickup element, potential control wiring is connected to the impurity region of a first conductivity type in each pixel. Therefore, excessive holes generated in the pixel on which high light is incident are prevented from being stored in the impurity region of the first conductivity type in the pixel by the potential control conducted via the potential control wiring. Therefore, the problem that the operation of the photodiode and the operation of the readout circuit in the pixel part are modulated is also solved.

According to the solid-state image pickup element according to the present embodiment and the solid-state image pickup device having the solid-state image pickup element, the potential in the potential control for the impurity region of the first conductivity type in the pixel part exercised via the potential control wiring can be controlled to become an arbitrary value. Therefore, it becomes possible to set a potential which is not zero volt serving as the so-called substrate potential. In the conventional art, therefore, the spatial spread of the depletion layer of the pn junction which forms the photoelectric conversion area in the pixel part uniquely depends upon the impurity structure. In the present embodiment, however, the spatial spread can be controlled arbitrarily. As a result, it becomes possible to adjust the non-sensitivity area formed between the semiconductor surface of the light incidence side and the depletion layer end by using the potential at the pixel part. Therefore, there is also an effect that further improvement of the blue sensitivity and the improvement of the yield can be implemented.

According to the solid-state image pickup element according to the present embodiment and the solid-state image pickup device having the solid-state image pickup element, it becomes possible to control the potential at the impurity region of the first conductivity type in the pixel area with a row as the unit by using potential control wiring formed with a row as the unit. As a result, it becomes possible to exercise optimum substrate potential control with a row taken as the unit in each of the reset operation of a photoelectric conversion element, signal charge transfer operation from the photoelectric conversion element, and signal charge storage operation in the photoelectric conversion element which are conducted by taking a row as the unit. Thus, it becomes possible to obtain a high performance solid-state image pickup element and a solid-state image pickup device which are high in sensitivity, low in noise and wide in dynamic range.

Furthermore, in a camera module and a solid-state image pickup device using a solid-state image pickup element according to the present embodiment, noise on the reproduced image is not generated in image pickup of a high illuminance subject. In addition, it is possible to improve the characteristics such as the dark current of the photodiode and the blue sensitivity by controlling the potential at the pixel part. Accordingly, a high performance camera module and solid-state image pickup device can be obtained.

According to the present embodiment, excessive charges generated when high light is incident can be discharged uniformly and accurately, as heretofore described.

Various other changes can be made without departing from the spirit of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A solid-state image pickup element comprising:
a semiconductor layer of a first conductivity type;
a pixel area having pixels formed in a matrix form, each of the pixels including a photoelectric conversion element having a pn junction formed of the semiconductor layer of the first conductivity type and a first semiconductor region of a second conductivity type different from the first conductivity type, a second semiconductor region of the first conductivity type formed on a first surface side of the semiconductor layer, and potential control wiring connected electrically to the second semiconductor region; and a pixel signal readout circuit including at least one MOS transistor formed on the first surface side of the semiconductor layer in the pixel area to have a source and a drain formed of an impurity region of the second conductivity type, wherein the first semiconductor region is disposed so as to be adjacent to the impurity region of the second conductivity type in the MOS transistor with interposing the semiconductor layer therebetween, and incidence of light to the photoelectric conversion element is made from a second surface side opposite to the first surface side.

2. The element according to claim 1, wherein the first semiconductor region extends to right under the impurity region of the second conductivity type of the MOS transistor.

3. The element according to claim 1, wherein the first semiconductor region is formed within the semiconductor layer so as to be covered by the semiconductor layer.

4. The element according to claim 1, wherein the potential control wiring is formed as wiring common to all pixels in the pixel area.

5. The element according to claim 1, wherein the potential control wiring is formed as wiring common to pixels disposed on the same row in the pixel area.

6. The element according to claim 5, wherein a pulsative potential synchronized to pixel readout operation with a row taken as unit is applied to the second semiconductor region through the potential control wiring.

7. The element according to claim 1, wherein a fixed DC potential is applied to the second semiconductor region through the potential control wiring.

8. The element according to claim 1, wherein a pulsative potential is applied to the second semiconductor region through the potential control wiring.

9. The element according to claim 1, wherein the readout circuit is provided for each pixel.

10. The element according to claim 1, wherein the readout circuit is provided for a plurality of pixels in the pixel area.

11. A solid-state image pickup device comprising:
the solid-state image pickup element according to claim 1;
an optical system which leads incident light to the solid-state image pickup element; and
a signal processor which conducts processing on an electric signal output from the solid-state image pickup element.

12. The device according to claim 11, wherein the first semiconductor region extends to right under the impurity region of the second conductivity type of the MOS transistor.

13. The device according to claim 11, wherein the first semiconductor region is formed within the semiconductor layer so as to be covered by the semiconductor layer.

14. The device according to claim 11, wherein the potential control wiring is formed as wiring common to all pixels in the pixel area.

15. The device according to claim 11, wherein the potential control wiring is formed as wiring common to pixels disposed on the same row in the pixel area.

16. The device according to claim 15, wherein a pulsative potential synchronized to pixel readout operation with a row taken as unit is applied to the second semiconductor region through the potential control wiring.

17. The device according to claim 11, wherein a fixed DC potential is applied to the second semiconductor region through the potential control wiring.

18. The device according to claim 11, wherein a pulsative potential is applied to the first semiconductor region through the potential control wiring.

19. The device according to claim 11, wherein the readout circuit is provided for each pixel.

20. The device according to claim 11, wherein the readout circuit is provided for a plurality of pixels in the pixel area.

* * * * *